United States Patent [19]

Borst et al.

[11] Patent Number: 4,842,135

[45] Date of Patent: Jun. 27, 1989

[54] CARRIER TAPE AND COVER APPLYING AND REMOVAL DEVICES FOR SAME

[75] Inventors: Herbert A. Borst, West Nyack; Zdenek MacHacek, Nanuet; Ernest Schnittger, Suffern, all of N.Y.; Richard D. Schulte, Niles, Ill.; Richmond Scott, Pleasantville; Paul A. Tilman, New City, both of N.Y.

[73] Assignee: Illinois Tool Works Inc., Chicago, Ill.

[21] Appl. No.: 46,259

[22] Filed: May 4, 1987

Related U.S. Application Data

[63] Continuation-in-part of Ser. No. 8,293, Jan. 29, 1987, which is a continuation-in-part of Ser. No. 913,131, Sep. 25, 1986.

[51] Int. Cl.4 .............................................. B65D 73/02
[52] U.S. Cl. ..................................... 206/328; 220/281
[58] Field of Search ............... 206/328, 330, 332, 334; 220/281

[56] References Cited

U.S. PATENT DOCUMENTS

| | | | |
|---|---|---|---|
| 1,676,868 | 7/1928 | Petersen | 220/281 |
| 3,484,016 | 12/1969 | Turner | 220/281 |
| 4,180,178 | 12/1979 | Turner | 220/281 |
| 4,187,953 | 2/1980 | Turner | 220/281 |
| 4,500,006 | 2/1985 | Lafortune et al. | 220/281 |
| 4,721,207 | 1/1988 | Kikuchi | 206/328 |
| 4,733,778 | 3/1988 | Boeckmann et al. | 206/328 |

Primary Examiner—Joseph Man-Fu Moy
Attorney, Agent, or Firm—Kane, Dalsimer, Sullivan, Kurucz, Levy, Eisele and Richard

[57] ABSTRACT

An improved carrier tape is disclosed comprising an elongated base strip and an elongated cover strip both formed of a plastic film material. The base strip is provided with longitudinally spaced cavities for components to be transported therein as well as a series of spaced, longitudinally extending sprocket drive holes for advancing the tape. The cover strip has a raised hump on its top surface positioned so as to align with the sprocket holes when the tape is assembled. The hump defines a living hinge for the adjacent surfaces of the cover strip top face. Accordingly, when the hump is depressed the sidewalls of the cover strip move outwardly so as to clear the edges of the base strip. Conversely, when the hump is released, the sidewalls return to their relaxed position.

A device for applying the cover strip to the base strip applies pressure to the hump of the cover strip while guiding the sidewalls of the cover strip around the top edge of the base strip.

A device for removing the cover strip from the base strip applies pressure to the cover strip hump thereby disengaging the sidewalls of the cover strip from the base strip while guiding the cover strip away from the base strip.

7 Claims, 3 Drawing Sheets

CARRIER TAPE AND COVER APPLYING AND REMOVAL DEVICES FOR SAME

CROSS REFERENCE TO RELATED APPLICATIONS

The present application is a continuation-in-part of application Ser. No. 008,293, filed Jan. 29, 1987, entitled CARRIER TAPE which in turn is a continuation-in-part of application Ser. No. 913,131 filed on Sept. 25, 1986 for REUSEABLE CARRIER TAPE.

BACKGROUND OF THE INVENTION

Carrier tapes are of ever increasing importance in assembly operations in numerous industries including, in particular, the electronics and pharmaceutical industries. The tapes are used, for example, to transport miniature and subminiature electronic components from a component manufacturer to a customer's assembly station where automatic equipment functions to remove the component from the carrier tape and mount the component to a circuit board or the like. The carrier tape (or transfer tape, as it is sometimes referred to) may also function to bring different components to an assembly station in proper order for sequential assembly.

Such carrier tapes are often in the form of a base strip of plastic, paper, or foil which is usually covered by a cover strip sometimes called top tape. The base strip is formed with a plurality of cavities or pockets for the components and the cover strip is secured to the base strip to thereby prevent the components from prematurely falling out of the cavities. In the past the base strip and cover strip were most commonly held in place by an adhesive, heat bond or spaced snap-type fasteners. Typical examples of prior art carrier tapes are disclosed in U.S. Pat. Nos. 3,465,874; 3,650,430; 3,700,019; 3,894,896; 3,910,410; and 4,298,120. The previously mentioned application Ser. Nos. 008,293 and 913,131 disclose carrier tapes which utilize a continuous mechanical interlock between the base strip and cover strip which obviates many of the problems associated with the use of the various prior art methods of securing the base strip and cover strip.

To function properly, a carrier tape must securely convey its cargo as required and then, at the proper location, be capable of being quickly and positively opened so that the component may be easily removed for assembly purposes. The tape should afford a degree of protection for the sensitive components to be conveyed therein with respect to contamination, electrostatic discharge, temperature change and mechanical shock. In addition, the seal or bond between the tape components must be releasable to a known and consistent value at the unloading point to insure that only the required length of base tape will be exposed.

Prior art tapes utilizing heat activated adhesives or heat bonding techniques present a risk of adhesive residue contamination of the component. In addition, such tapes cannot be readily opened and reclosed for quality testing or the like and present difficulties in aligning the cover and base strips. Further, heat bonding requires the use of relatively high temperatures which may be harmful to the components to be carried. In addition, the use of staticdissipative or conductive additives to prevent or dissipate the build-up of electrostatic charges tend to interfere with the bonding characteristics of the adhesives used.

In view of the above, it is the principal object of the present invention to provide an improved carrier tape construction which avoids the use of adhesive and chemical bonding and in which the cover strip and base strip are uniformly and consistently secured to one another yet which can readily and positively be separated from one another.

A further object is to provide a tape construction wherein the cover and base strips automatically align with each other during assembly and which, if necessary, may be opened and reclosed.

Another object is to provide such a tape which may readily be used on existing equipment with little or only minor modification.

A still further object is to provide a simple and reliable mechanism for properly securing the base and cover strips of such a carrier tape to each other.

Still another object is to provide a simple and reliable mechanism for properly separating the base and cover strips of such a carrier tape from one another.

SUMMARY OF THE INVENTION

The above and other beneficial objects and advantages are attained in accordance with the present invention by providing an improved carrier tape comprising an elongated base strip and an elongated cover strip both formed of a plastic film material. The base strip is provided with longitudinally spaced cavities for components to be transported therein as well as a series of spaced, longitudinally extending sprocket drive holes for advancing the tape through an associated assembly machine. The cover tape has sidewalls extending downwardly and terminating in inwardly directed barbs or profiles. The spacing between the sidewalls is substantially equal to the width of the base strip. A raised, longitudinally extending hump is provided projecting upwardly from the top face of the cover strip. In the preferred arrangement the hump is positioned so as to align with the sprocket holes when the tape is assembled. The hump defines a living hinge for the adjacent surfaces of the cover strip top face. Accordingly, when the hump is depressed the sidewalls of the cover strip move laterally outwardly so as to clear the edges of the base strip and permit removal of the cover strip. Conversely, when the hump is released, the sidewalls return to their relaxed position securely interlocking with the base strip edges.

A device for applying the cover strip to the base strip includes means for applying pressure to the hump of the cover strip and means for guiding the sidewalls of the cover strip around the edges of the base strip.

A device for removing the cover strip from the base strip includes means for applying pressure to the cover strip hump as well as a guide for removing the cover strip from the base strip and directing the cover strip out of the path of motion of the base.

BRIEF DESCRIPTION OF THE DRAWINGS

In the accompanying drawings.

DETAILED DESCRIPTION OF THE PREFERRED EMBODIMENT

Improved Carrier Tape

Figure 1:
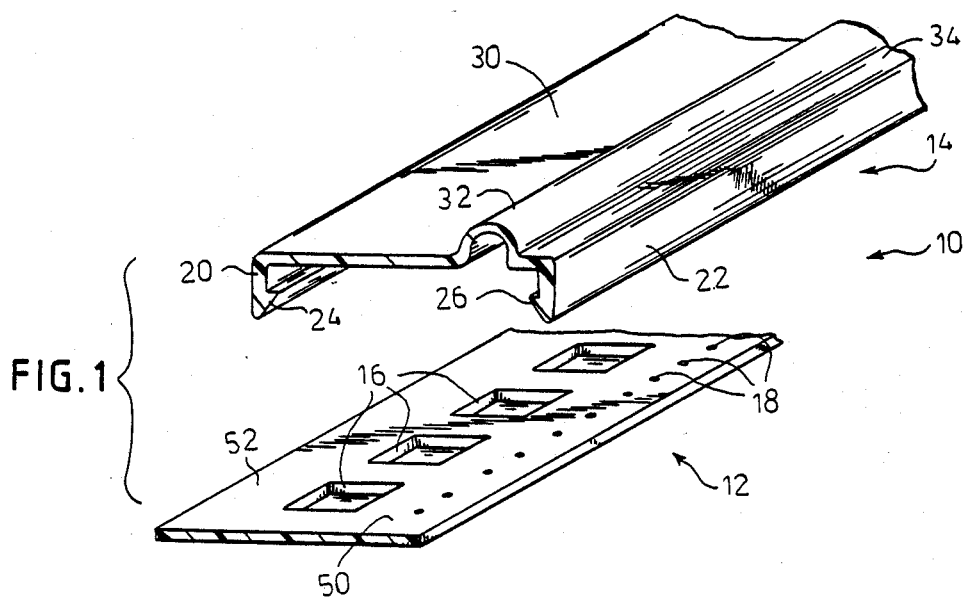
FIG. 1 is a fragmentary, exploded, perspective view of a carrier tape in accordance with the present invention.
Figure 2:
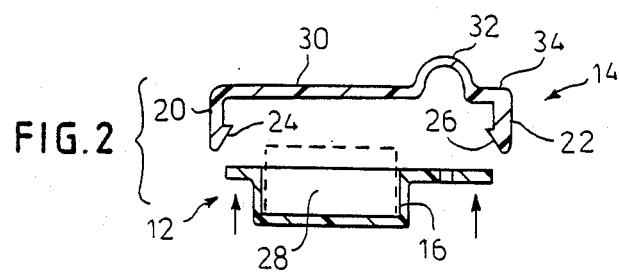
FIG. 2 is an exploded, side elevational sectional view of the carrier tape of FIG. 1.

Reference is now made to the drawings and to FIGS. 1–4 in particular wherein a carrier tape 10 is depicted as comprising an elongated base strip and generally coextensive cover strip 14. The carrier tape 10 is preferably formed of a suitable plastic film material such as carbon loaded polyvinyl chloride, polypropylene or a glycol based polyester such as polyethylene terephthalate (PETG) which may readily be extruded and vacuum or pressure formed to the desired shape. The carrier tape resin may be formulated with appropriate additives to render the tape components anti-static or static dissipative as may be required. The tape should be sufficiently flexible to permit it to be spooled.

The base 12 is formed with a plurality of cavities 16 which define individual pockets for the components to be conveyed therein. In this regard, the cavities may be contoured, as required, to maintain the components in a particular orientation should such orientation be necessary. A series of aligned sprocket holes 18 is provided extending through the base strip 12, adjacent to and outward of the cavities 16.

Figure 4:
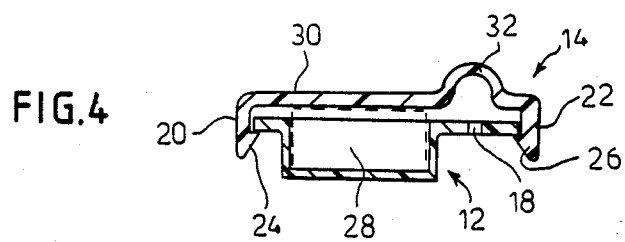
FIG. 4 is a side elevational sectional view of the carrier tape of FIG. 1 as assembled.

The cover strip 14 is coextensive in length with the base strip 12. The cover strip 14 is provided, at each side, with a downwardly directed sidewalls 20,22 each of which terminates in an inwardly directed profile barb 24,26. The sidewalls are spaced apart from each other a distance substantially equal to the width of the base strip. The height of the sidewalls 20,22 is such that when the cover strip 14 is engaged over the base strip the major portion of the top face 30 of the cover strip will cover a component 28 within cavity 16 while the profiles 24 and 26 engage the edges of the undersurface of the base strip, as shown in FIG. 4.

Figure 3:
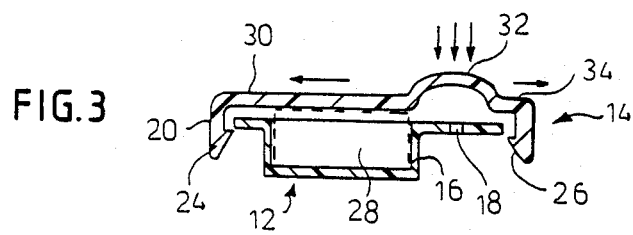
FIG. 3 is a side elevational sectional view of the carrier tape of FIG. 1 as subjected to a force to enable assembly or disassembly of the tape.

In accordance with the present invention, the top tape 14 is further provided with a longitudinally extending upwardly projecting hump 32 along its entire length. The hump 32 is positioned to align over the line of sprocket holes 18 thereby providing clearance for engaging the protruding teeth of the sprocket drive wheel of the assembly equipment with which the tape is to be used. The hump 32 also provides a "living hinge" for the major 30 and minor 34 portions of the top face of the cover strip defined on opposite sides of the hump. Thus, when a downward force is exerted on the hump, both the major and minor face portions along with their attached sidewalls 20,22 will move laterally outwardly. The extent of outward movement of the faces, in turn, is determined by the downward displacement of the hump. Accordingly, by making the hump high enough and by exerting a sufficient downward force, the profile barbs 24,26 may be shifted clear of the edges of the base strip thereby releasing the cover strip from the base strip, as shown in FIG. 3. As shown in FIG. 4, the hump, when relaxed, tends to bias the sidewalls 20,22 toward each other thereby providing a positive connection between the cover strip and base strip when assembled. It should be appreciated that the cover strip automatically aligns over the base strip by virtue of the sidewalls 20,22 engaging the side edges of the base. In addition, the tape may be opened as may be required for sampling or other purposes and then readily reclosed.

Tape Joining Device

Figure 5:
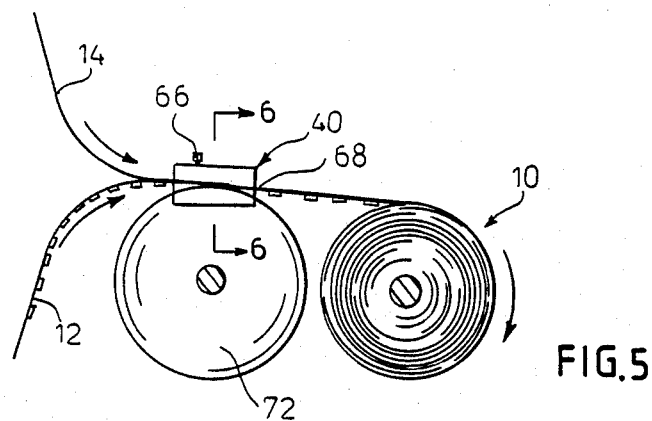
FIG. 5 is a diagrammatic view of a station for joining the top and bottom strips of the present carrier tape.
Figure 6:
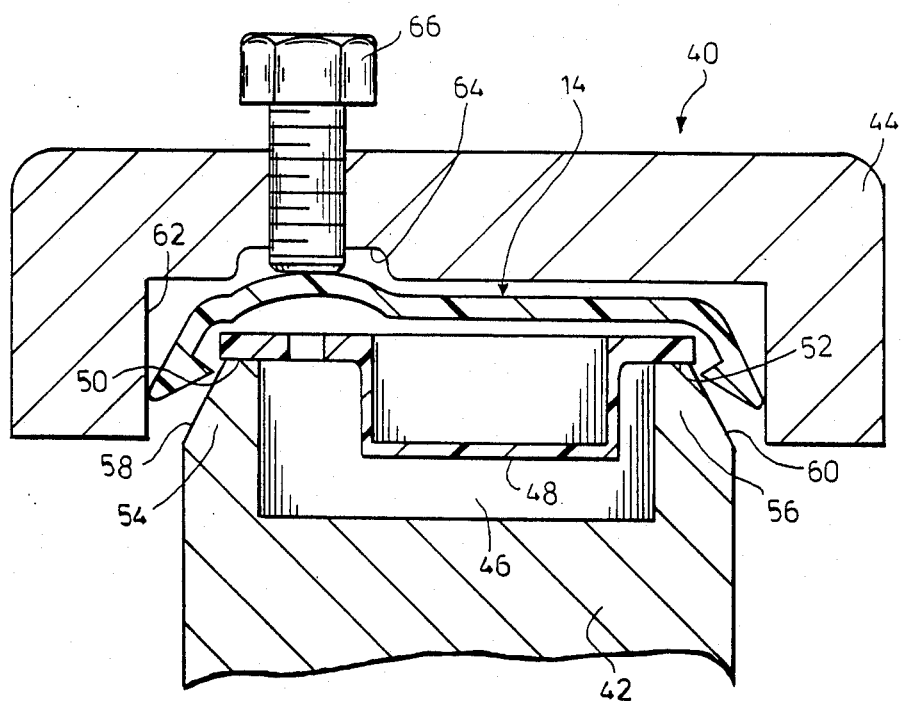
FIG. 6 is an enlarged fragmentary sectional view taken along reference lines VI—VI of FIG. 5.

An apparatus for joining the bottom and top strips 12 and 14 of the carrier tape 10 is disclosed in FIGS. 5 and 6. As shown, a bottom strip 12, the cavities of which are loaded with components is brought horizontally to the joining station 40. A top strip 14 is also brought to the loading station where it is applied to the bottom strip. The assembled carrier tape 10 is then drawn off and spooled for subsequent shipment and use.

The details of the joining station 40 are shown in FIG. 6. As shown, the joining station comprises a guide 42, which may be in the shape of a wheel, and a contoured feed channel plate 44 positioned over the guide. The top edge of guide 42 is provided with a central grove 46, the depth of which is sufficient to provide clearance for the bottom 48 of the component cavities 16 while the bottom edges 50,52 of the bottom strip rest on the edges 54,56 that define groove 46 of the wheel 42. The outside surfaces 58,60 of the guide adjacent the bottom strip edge are tapered inwardly to define camming surfaces for the sidewalls 20,22 of the top strip as will be described.

The top strip 14 is brought to the joining station where it tracks the contoured inner face 62 of the feed channel plate 44. The inner face 62 of plate 44 is provided with a ridge 64 to receive the hump 32 of the top strip. The height of the ridge gradually decreases towards the exit end of the joining station so as to gradually apply pressure to the top strip hump and thereby cause the sidewalls 20,22 of the top tape to move laterally outwardly as shown in FIG. 3. An adjustable pressure screw 66 may be provided to insure that sufficient pressure is applied to the top strip hump to obtain the necessary lateral movement of the top strip sidewalls to clear the side edges of the base strip. To this end, the sidewalls 20,22 are spread out sufficiently so that the profile barbs 24,26 ride along the angled cam surfaces 58,60 as shown.

At the exit 68 of the joining station 40 pressure is removed from hump 32 of the top strip. At the same time, the angled cam surfaces 58,60 are removed from supporting the sidewalls 20,22 outwardly. As a result, the resiliency of the sidewalls 20,22 coupled with the hinge action of the hump cause the sidewalls to snap inwardly towards each other thereby securely engaging the edges of the bottom strip as shown in FIG. 4.

Tape Separating Device

Figure 7:
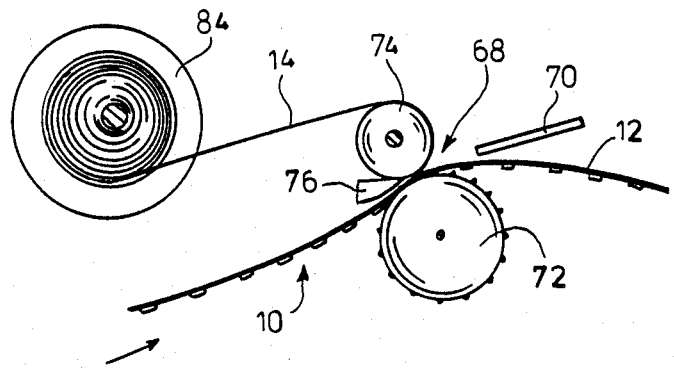
FIG. 7 is a diagrammatic view of a station for separating the top and bottom strips of the present carrier tape.
Figure 8:
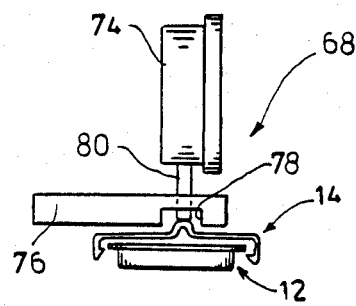
FIG. 8 is a simplified front view of the stripping mechanism of the station of FIG. 7; and, FIG. 9 is a simplified side view of the stripping mechanism.
Figure 9:
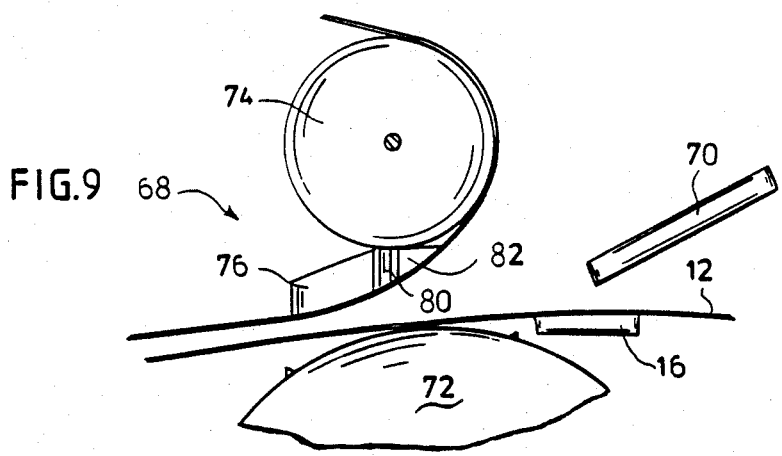

A device for stripping the cover 14 from the carrier tape 10 is depicted in FIGS. 7-9. It should be appreciated that the cover stripping mechanism 68 is designed to be used with existing "pick and place" carrier tape utilizing machines 70 without disturbing their normal functions of picking a component from the carrier tape 10 and placing it in position for surface mounting or some other operation.

In this regard, the cover stripping device 68 comprises a toothed drive wheel 72 which engages the carrier tape sprocket holes 18 in a conventional manner to advance the tape 10 to the pick and place mechanism 70. As previously mentioned, the teeth of wheel 72 have a clearance area above each sprocket hole 18 of the tape by virtue of the hump 32 being positioned above the sprocket holes. At the mechanism 70, the carrier tape must be open and the cover stripped away so that the component contained therein can be removed without interference. To this end, the cover stripping mechanism 68 is positioned slightly upstream of the pick up device 70 as shown in FIG. 7. The cover stripping mechanism 68 comprises a grooved wheel 74 and a stripping plate 76 mounted to the tape transport mechanism frame. The stripping plate 76 is provided with a groove 78 dimensioned to capture the hump 32 of the cover strip 14 of tape 10. A threaded or adjustable pressure rod 80 extends through the groove 78 to exert pressure on the top of the hump 32 thereby causing the sidewalls 20,22 of the tape to flex outwardly to laterally clear the edge of the bottom strip (as shown in FIG. 3). By raising or lowering the screw 80, the pressure exerted on the hump may be varied as required. The leading edge 82 of stripping plate 76 is tapered to lead the now separated cover strip 14 over the grooved wheel to a conventional take up spooler 84. At the same time, the now exposed cavity 16 of the base strip is in position for the pick and place mechanism 70 to remove the component contained within the cavity. It should be noted that the angle of the leading edge 82 of the stripping plate is important in order to guide the tape cover strip up and away from the base strip so as not to interfere with the pick and place mechanism 70.

Thus, in accordance with the above, the aforementioned objectives are effectively attained.

Having thus described the invention, what is claimed is:

1. A carrier tape comprising:

an elongated base strip;

an elongated cover strip formed of a resilient plastic material substantially coextensive in length with said base strip, said cover strip having a top surface and opposed sidewalls extending downwardly from the top surface and spaced apart from each other a distance substantially equal to the width of said base strip and cooperating to secure said cover strip to said base strip, and a hump coextensive with said cover strip extending longitudinally, parallel to said sidewalls, projecting upwardly from the top surface, whereby when said hump is depressed said sidewalls move outwardly, away from each other to release said cover strip from said base strip.

2. The carrier tape in accordance with claim 1 wherein each of said sidewalls terminates in an inwardly directed barb projecting beneath said base strip, said barbs extending a distance such that when said hump is depressed said barbs move outwardly to clear said base strip.

3. The carrier tape in accordance with claim 1 wherein said base strip includes a plurality of longitudinally spaced, downwardly extending component cavities therein.

4. The carrier tape in accordance with claim 1 wherein said base strip includes a plurality of longitudinally spaced sprocket holes extending therein.

5. The carrier tape in accordance with claim 4 wherein said sprocket holes are aligned with said cover strip hump.

6. The carrier tape in accordance with claim 1 wherein said base strip includes a plurality of longitudinally spaced sprocket holes extending therein adjacent said cavities.

7. The carrier tape in accordance with claim 6 wherein said sprocket holes are aligned with said cover strip hump.

* * * * *